356-400 SR

OR 3,811,779

X 2090 E

United States

Jacobs et al.

] 3,811,779

] May 21, 1974

[54] APPARATUS FOR ALIGNING A MASK WITH RESPECT TO A SEMICONDUCTOR SUBSTRATE

[75] Inventors: Bernardus Antonius Johannus Jacobs; Pieter Kramer, both of Emmasingel, Eindhoven, Netherlands

[73] Assignee: U.S. Philips Corporation, New York, N.Y.

[22] Filed: Dec. 30, 1971

[21] Appl. No.: 214,122

[30] Foreign Application Priority Data

Jan. 8, 1971 Netherlands ...................... 7100212

[52] U.S. Cl. ................................ 356/172, 356/114

[51] Int. Cl. ........................................ G01b 11/26

[58] Field of Search ........... 356/172, 114, 118, 119

[56] References Cited

OTHER PUBLICATIONS

Proceedings Kodak Photoresist Seminar, May 19–20, 1969, page 62.

*Primary Examiner*—Ronald L. Wibert

*Attorney, Agent, or Firm*—Frank R. Trifari

[57] ABSTRACT

An apparatus for aligning a mask comprising a large number of equal elements with respect to a semiconductor substrate is described. It is stated that for this purpose two patterns are used which each comprise at least three grating-shaped configurations of which two are oriented at right angles to one another and are spaced from one another by a distance which is small compared with the distance by which they are spaced from a third configuration the groove direction of which is substantially parallel to the line joining it to the two first-mentioned configurations.

It is explained that one pattern is rigidly secured to the substrate and the other pattern is rigidly secured to the mask, images of the two patterns being formed about at the location of a reference pattern which also comprises at least three grating-shaped configurations.

5 Claims, 4 Drawing Figures

APPARATUS FOR ALIGNING A MASK WITH RESPECT TO A SEMICONDUCTOR SUBSTRATE

The invention relates to an apparatus for aligning a mask comprising a large number of equal elements with respect to a semiconductor substrate.

Such an apparatus is described in Proceedings Kodak Photoresist Seminar May 19–20, 1969, page 62.

In the known apparatus there are provided on the mask and on the substrate patterns of suitable shape in the form of a reflecting square on the substrate and of a radiation-permeable frame the outlines of which are concentric squares on the mask. The side of the inner square on the mask is slightly smaller than the side of the reflecting square on the substrate, which in turn is slightly smaller than the side of the outer square on the mask.

Two pairs of photosensitive detectors are arranged so that the line joining the detectors of one pair is at right angles to the line joining the detectors of the other pair. A light beam which passes through the frame is reflected at the reflecting square on the substrate and produces an electric signal in each of the photosensitive detectors. When the difference signal from the two detectors of the same pair is zero for each pair, the position of the mask relative to the substrate is the desired one, neglecting a rotation of the mask relative to the substrate. By means of a second set of patterns which is congruent with the set of patterns on the mask and on the substrate and is suitably spaced therefrom relative rotation of the mask and the substrate may be eliminated. For this purpose the difference signal obtained from the two photosensitive detectors of a third detector pair which are joined by a line parallel to the line joining one of the other pairs must again be zero.

By means of the known apparatus a plurality of masks the equal elements of which have different shapes in each mask are imaged at the same location of the substrate. Between each pair of successive imagings the substrate is subjected to the desired physical and chemical changes. Thus a passive and/or active element is obtained which is generally referred to as an integrated circuit.

The degree of accuracy required when manufacturing integrating circuits has to satisfy increasingly exacting requirements. This requires that the location at which successive masks are to be imaged on the substrate should be determined with ever increasing accuracy. Deviations greater than, for example, 1 micron may be prohibitive. The known apparatus does not satisfy the extreme requirement that successive masks are imaged at the prescribed position on the semiconductor substrate within the said extremely small tolerances and with a high degree of reliability.

This is due to the fact that during some of the chemical and physical processes to which the substrate is subjected its reflection coefficient is changed. It is not unlikely that this change will not be the same throughout the entire surface area of the substrate. Consequently a zero difference signal from the two detectors of one pair does not guarantee that the mask and the substrate are in the desired relative position.

It is an object of the invention to provide an apparatus of the above type which does not suffer from the disadvantage to which the known apparatus is subject.

For this purpose the apparatus according to the invention is characterized in that two patterns are used which each comprise at least three grating-shaped configurations two of which are oriented at right angles to one another and are spaced from one another by a distance which is small compared with the distance by which the two configurations are spaced from a third configuration in which the direction of the grooves is substantially parallel to the line joining this configuration to the two first-mentioned configurations, one pattern being rigidly secured to the substrate and the other being rigidly secured to the mask, whilst images of the two patterns are formed approximately at the location of a reference pattern which likewise comprises at least three grating-shaped configurations two of which are oriented at right angles to the third in a manner such that the distance by which two of the grating-shaped configurations are spaced from one another is small with respect to the distance by which the two configurations oriented at right angles to one another are spaced from the third configuration, the radiation used for producing the images being applied, after interaction with the reference pattern, to three pairs of detectors in which electric signals are produced the mutual phase differences of which are a measure of the relative positions of the two patterns.

Advantageously an alternating voltage is always produced in the detectors. According to one aspect of the invention, for this purpose the reference pattern is given a motion relative to the images which has a velocity component in the period directions of the grating-shaped configurations of the reference pattern. According to another aspect of the invention there is inserted in the path of the radiation emitted by a source of plane-polarized light to each of the detectors an electro-optical modulator, and the sub-beams of different orders of diffraction obtained by diffraction at the grating-shaped configurations are differently polarized by the insertion of a phase-anisotropic element in at least one of the sub-beams.

Advantageously each of the grating-shaped configurations is made up of at least two parts the periods of which are slightly different.

Embodiments of the invention will now be described, by way of example, with reference to the accompanying diagrammatic drawings, in which.

Figure 1:
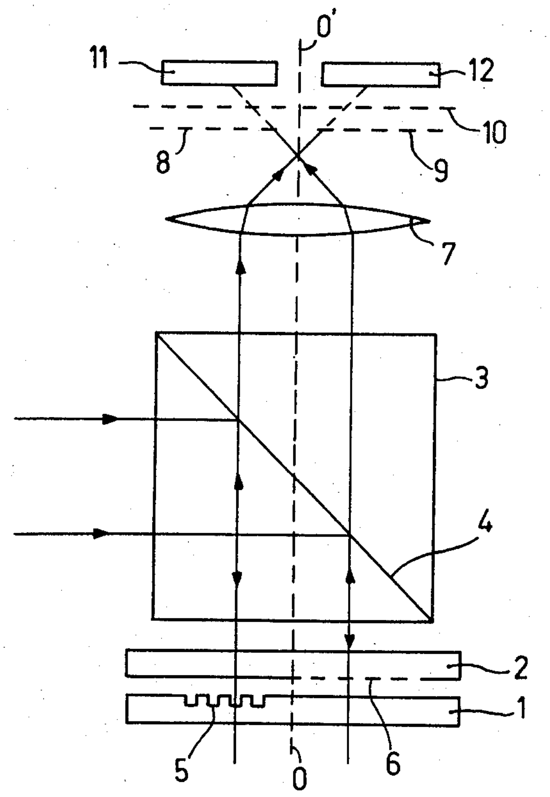
FIG. 1 shows a first embodiment of an apparatus according to the invention.

Referring now to FIG. 1, a collimated beam of radiation from a source of radiation (not shown) falls on a beam-splitting prism 3. The beam of radiation is reflected at the interface 4 of the beam-splitting prism and falls on a semiconductor substrate 1 through a photomask 2. At the edge of the photomask there is arranged a grating 6, at the edge of the substrate there is arranged a grating 5. The grating 6 is an amplitude grating, the grating 5 a phase grating. The grating 5 must be a phase grating, because foreign substances which adhere to the substrate disturb the diffusion processes to which the substrate is subjected to obtain the desired integrated circuit.

An image 8 of the grating 6 is formed via the beam-splitting prism 3 and a lens 7, and an image 9 of the grating 5 is formed via the beam-splitting prism 3 and the lens 7. The two images lie in one plane, one on either side of an axis 0—0′ of the lens 7.

A reference grating 10 is provided in close proximity to the imaging plane. The period of the image 8, that of the image 9 and that of the grating 10 are equal. When the grating 10 is moved there are produced in detectors 11 and 12 sinusoidal signals of values $a \sin\Omega_1 t$ and $b \sin(\Omega_1 t + \phi_1)$ respectively, where $\Omega_1$ is the velocity in periods per second of the grating 10. These signals are compared with one another. A phase difference $\phi_1 = \phi_{01}$ is set, for example by electric means or by hand.

For simplicity only one set of three gratings, i.e., a grating on the substrate, a grating on the mask and a reference grating, is shown in the Figure. Obviously there will be two more sets of three gratings each. The grating lines of one set, which is located in close proximity to the first set (5, 6, 10) are at right angles to those of the first set; the grating lines of the other set, which is spaced by some distance from the remaining sets, are at right angles to the plane of the drawing. Advantageously the centre M of the closely adjacent gratings on the substrate and the mask coincides with the pivot point of the moving mechanism.

Figure 2:
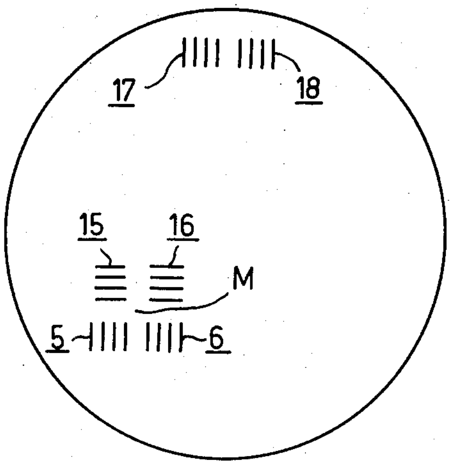
FIG. 2 shows a part of the apparatus shown in FIG. 1.

FIG. 2 is a top plan view of the two sets of three gratings each, showing the gratings on the mask and on the substrate only. The beam of radiation which images the gratings 15 and 16, after interaction with the associated reference grating produces signals in detectors (not shown), which signals may be written as $c \sin\Omega_2 t$ and $d \sin(\Omega_2 t + \phi_2)$, where $\Omega_2$ is the velocity in periods per second of the said associated reference grating. The beam of radiation which images the gratings 17 and 18, after interaction with the associated reference grating produces signals in detectors (not shown), which signals may be written as $p \sin\Omega_3 t$ and $q \sin(\Omega_3 t + \phi_3)$, where $\Omega_3$ is the velocity in periods per second of the desired associated reference grating. The correct adjustment of the mask relative to the substrate is obtained when $\phi_1$, $\phi_2$ and $\phi_3$ have reached prescribed values $\phi_{01}$, $\phi_{02}$ and $\phi_{03}$ respectively. To get an average of any changes in shape it may be advantageous to provide more grating-shaped configurations on the substrate and on the mask and to average over the various phases. Because $\phi_1$, $\phi_2$ and $\phi_3$ are periodic (their period is proportional to the associated grating period), the range within which $\phi_{01}$, $\phi_{02}$ and $\phi_{03}$ are uniquely determined is smaller than the grating period. To enlarge this range there is added to each grating pattern a pattern having a slightly different period. The correct adjustment of the mask relative to the substrate will now be attained if not only $\phi_1$, $\phi_2$ and $\phi_3$ have reached the prescribed values $\phi_{01}$, $\phi_{02}$ and $\phi_{03}$, but simultaneously $\phi_1'$, $\phi_2'$ and $\phi_3'$ (associated with the added patterns) also have reached their prescribed values $\phi_{01}'$, $\phi_{02}'$ and $\phi_{03}'$, respectively.

As an alternative to moving the reference pattern an electro-optical modulator may be inserted into the path of the radiation between the light source and the detectors. In this arrangement, during positioning the reference pattern is immovable with respect to the mask or the substrate. Plane polarized light is used which via the grating patterns on the mask and on the substrate is split into sub-beams of, inter alia, the orders −1, 0 and +1. One of the sub-beams which emanate from the grating pattern on the substrate, for example the sub-beam of the order −1, traverses a phaseantisotropic element, for example a λ/2 plate having an orientation such that the plane of polarization of the respective sub-beam is rotated through 90°. At the location of the reference grating the sub-beams polarized at right angles to one another, the sub-beams of the order +1 and those of the order −1 respectively, are combined. (The sub-beam of the order 0 is intercepted by a screen).

The sub-beams of the orders (+1, −1) and (−1, −1) which emanate from the reference grating and are directionally coincident but polarized at right angles to one another are divided in an anisotropic beam-splitting prism and then subjected to polarization modulation in the electro-optical modulator and intercepted by two polarization-sensitive detectors.

The electric signals produced in the detectors after filtering about $\omega$ are proportional to:

$\cos\omega t \cos(kz + 2\phi)$ and $\sin\omega t \sin(kz + 2\phi)$ respectively.

Figure 3:
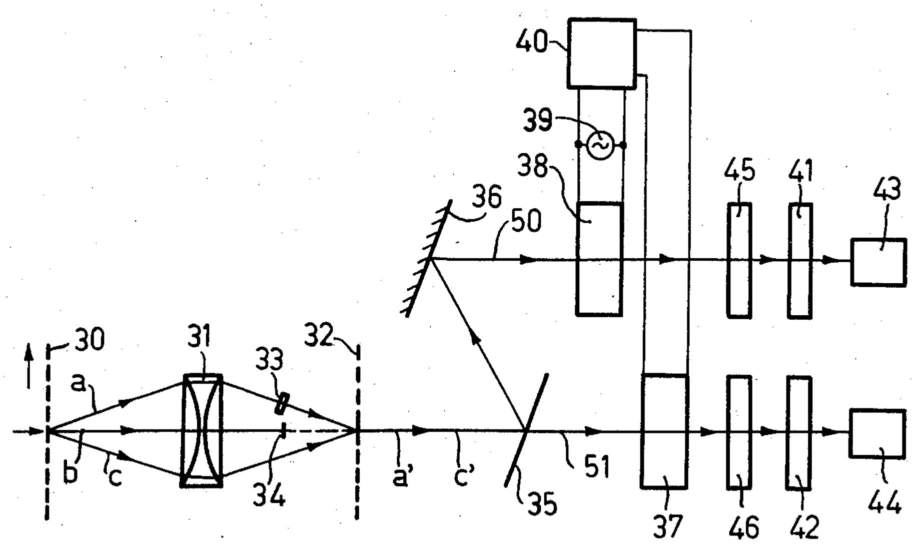
FIG. 3 shows a second embodiment.

FIG. 3 shows schematically an arrangement using a reference grating which is stationary relative to the mask or the substrate. A collimated beam of plane-polarized light falls on one of the three gratings on the substrate. The sub-beams *a*, *b* and *c* or the orders +1, 0 and −1 respectively which are reflected from this grating (30) are combined by a lens 31 at about the location of a reference grating 32. (For simplicity, the sub-beams are shown in the drawing as beams transmitted by the grating.) In the path of the beam *a* there is inserted a λ/2 plate 33 the principal directions of which are at an angle of 45° to the direction of polarization of the incident plane-polarized sub-beam. The λ/2 plate 33 rotates the plane of polarization of the subbeam *a* through 90°. In the path of the sub-beam *b* there is inserted a screen 34 which absorbs this sub-beam. The sub-beam *c* (of the order −1) freely reaches the reference grating 32. The reference grating transmits the directionaly coincident sub-beams, i.e. a sub-beam *a′* of the order (+1, +1) and a sub-beam *c′* of the order (−1, −1). The direction of polarization of the plane-polarized sub-beam *a′* is at right angles to that of the plane-polarized sub-beam *c′*. The resulting beam has an elliptic state of polarization the parameters of which are determined by the phase difference of the respective sub-beams. The phase difference of the subbeams is in turn determined by the positions of the gratings 30 and 32.

Parts of both sub-beams are reflected at an isotropic beam-splitting mirror 35 to a mirror 36, whilst the remaining parts are transmitted. The light beam (50) reflected at the mirror 36 passes through an electro-optical modulator 38. The light beam (51) transmitted by the beam-splitting mirror 35 passes through an electro-optical modulator 37. Both electro-optical modulators may be, for example, KDDP (potassium dideuterium phosphate) crystals. An axial electric field of value $A_o \cos\omega t$ is applied to the electro-optical modulator 38 by an alternating-voltage source 39, and an axial electric field of value $B_o \sin\omega t$ is applied to the electro-optical modulator 37 by the same source 39 through a phase-shifting network 40.

The polarization states of the elliptically polarized light beams incident on the modulators are influenced by these modulators according to the $\cos\omega t$ function and the $\sin\omega t$ function respectively. In λ/4 plates 45 and 46 respectively the elliptically polarized light beams are converted into plane-polarized light beams. For this purpose the principal directions of the plates are at angles of 45° to the direction of polarization of the sub-beams incident on the reference grating 32. The plane-polarized light beams which emerge from the $\lambda/4$ plates 45 and 46 and the planes of polarization of which rotate according to a $\cos\omega t$ function and a $\sin\omega t$ function respectively fall on analyzers 41 and 42 respectively the directions of polarizations of which are at an angle of 45° to one another. The beams incident on detectors 43 and 44 may be represented by $P \cos\omega t \sin\ kz+2(\gamma+\pi/4\ )$ and $P \sin\omega t \sin\ (kz+2\alpha)$ respectively. In these expressions $k=2\pi/\lambda$, $z$ is the position of the grating 30 and $\alpha$ is the angle between the directions of polarization of the light beam incident on the grating 30 and of the polarizer 42.

The electric signals produced in the detectors 43 and 44 may readily be processed electrically. Addition gives an electric quantity proportional to $\sin(\omega t+kz+2\alpha)$.

Figure 4:
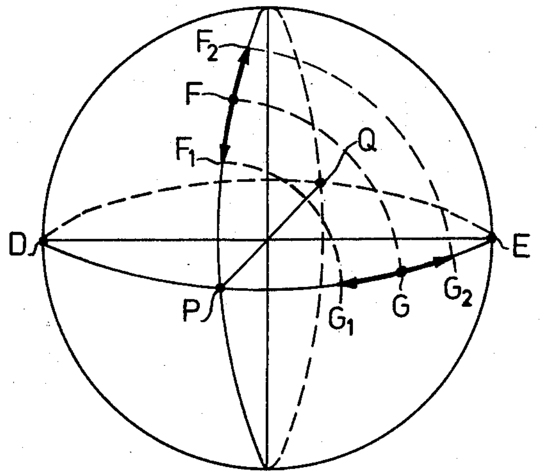
FIG. 4 is a geometrical figure illustrating the operation of the apparatus shown in FIG. 3.

FIG. 4 shows the polarization states of the sub-beams of the Poincare sphere. Diametrically opposed points D and E on the equator represent the polarization states of the plane-polarized sub-beams at the location of the reference grating 32. A point F on the great circle the plane of which is at right angles to the line DE represents the polarization state of the directionally coincident sub-beams which have passed through the grating 32. This polarization state is modulated in the electro-optical crystals 37 and 38. $F_1$ and $F_2$ are the ends of the line which represents this modulated polarization state. After passing through the $\lambda/4$ plates 45 and 46 respectively the polarization state of the sub-beams is represented by a line segment $G_1 G_2$ on the equator.

Obviously a system as shown schematically in FIG. 3 is required for each of the six gratings (see FIG. 2).

In the arrangement shown in FIG. 3 the screen 34 may be inserted in the path of the sub-beam *c* of the order −1 instead of in that of the zero-order sub-beam *b*. Also, instead of inserting a $\lambda/2$ plate in the path of the sub-beam *a*, $\lambda/4$ plates may be inserted, one in the path of this sub-beam and the other in the path of the sub-beam *c*, the principal directions of the latter plates being at angles of +45° and −45° respectively to the direction of the relevant incident sub-beam. In this case, there must be inserted in the paths of the directionally coincident sub-beams before each of the electro-optical crystals $\lambda/4$ plates the corresponding principal directions of which are at angles of 90° to those of the plates 45 and 46 respectively. These $\lambda/4$ plates may alternatively be replaced by a single $\lambda/4$ plate inserted between the reference grating 32 and the beamsplitting mirror 35. Obviously, the mask pattern need not be provided on the substrate by a contact process but it may alternatively be provided by imaging. In this case the same positioning procedure may be used.

What is claimed is:

1. Apparatus for aligning a mask with respect to a semiconductor substrate, comprising for each direction with respect to which alignment is desired:

a first phase grating attached to said substrate with the grating lines perpendicular to the direction on said substrate with respect to which alignment is desired;

a second grating attached to said mask with the grating lines perpendicular to the corresponding direction on said mask with respect to which alignment is desired;

a third reference grating;

first and second light intensity detectors;

means for optically imaging said first and second gratings through said reference grating to said first and second detectors respectively; and means for modulating said images, whereby the respectively detected light intensities are periodically varying with respective phase angles which are a measure of the respective position of said first and second gratings, the difference between said phase angles being a measure of the relative position of said mask with respect to said substrate.

2. The apparatus as claimed in claim 1 wherein said means for modulating said images comprises means for modulating said reference grating in the period direction.

3. The apparatus as claimed in claim 1 wherein said means for imaging and means for modulating comprises:

a source of plane-polarized light directed toward said first and second gratings, to produce respective diffraction patterns each having subbeams of different orders of diffraction;

a phase-anisotropic element positioned in the path of a subbeam of each pattern, to polarize said subbeam differently from a subbeam of another order of diffraction;

a lens to combine said differently polarized subbeams of said respective diffraction patterns at said third grating; and an electro-optical modulator to modulate said combined subbeams.

4. Apparatus for aligning a mask with respect to a semi-conductor substrate, comprising for each direction with respect to which alignment is desired, a first group of elements as recited in claim 1, and a second group of elements as recited in claim 1, wherein the periods of said first, second, and third gratings of said first group are slightly different from the respective periods of said first, second, and third gratings of said second group.

5. The apparatus as defined in claim 1 wherein alignment is desired in three directions, the three first gratings attached to said substrate to correspond with said three directions and the three second gratings attached to said mask to correspond with said three directions forming an identical pattern on said substrate and on said mask in which pattern two gratings are oriented perpendicular to each other and spaced from each other by a distance which is small compared with the distance by which they are spaced from the other grating, the period direction of said other grating being perpendicular to a line joining said other grating with said two gratings.

* * * * *